United States Patent
Tan et al.

(10) Patent No.: US 9,466,254 B2
(45) Date of Patent: Oct. 11, 2016

(54) SHIFT REGISTER UNIT, GATE DRIVING CIRCUIT AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Wen Tan, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengu, Sichuan Province (CN)

( * ) Notice: Subject to any disclaimer, the term of this patent is extended or adjusted under 35 U.S.C. 154(b) by 27 days.

(21) Appl. No.: 14/429,026

(22) PCT Filed: Jun. 17, 2014

(86) PCT No.: PCT/CN2014/080116
§ 371 (c)(1),
(2) Date: Mar. 18, 2015

(87) PCT Pub. No.: WO2015/090019
PCT Pub. Date: Jun. 25, 2015

(65) Prior Publication Data
US 2016/0086562 A1 Mar. 24, 2016

(30) Foreign Application Priority Data

Dec. 20, 2013 (CN) .......................... 2013 1 0713643

(51) Int. Cl.
*G11C 19/00* (2006.01)
*G09G 3/36* (2006.01)
*G11C 19/28* (2006.01)

(52) U.S. Cl.
CPC .......... *G09G 3/3677* (2013.01); *G09G 3/3648* (2013.01); *G11C 19/28* (2013.01);
(Continued)

(58) Field of Classification Search
None
See application file for complete search history.

(56) References Cited

U.S. PATENT DOCUMENTS

| 8,019,039 B1 * | 9/2011 | Tsai ..................... G11C 19/184 377/64 |
| 2008/0187089 A1 | 8/2008 | Miyayama et al. |

(Continued)

FOREIGN PATENT DOCUMENTS

| CN | 101242178 A | 8/2008 |
| CN | 101625839 A | 1/2010 |

(Continued)

OTHER PUBLICATIONS

International Search Report Appln. No. PCT/CN2014/080116; Dated Sep. 30, 2014.

(Continued)

*Primary Examiner* — Tuan T Lam
(74) *Attorney, Agent, or Firm* — Ladas & Parry LLP

(57) ABSTRACT

A shift register unit, a gate driving circuit and a display apparatus. The shift register unit comprises a bidirectional scan pre-charging module, a pulling-up module, a pulling-down control module, a reset module and a pulling-down module. A connection point where the bidirectional scan pre-charging module and the pulling-up module are connected serves as a pulling-up control node. A connection point where the pulling-down control module and the pulling-down module are connected serves as a pulling-down control node. The pulling-down control module is configured to perform a pulling-down control according to signals inputted from the second clock signal terminal, the third clock signal terminal, and the fourth clock signal terminal. A bidirectional scanning can be achieved by the bidirectional scan pre-charging module, and the potential at the pulling-up control node and the output signal of the signal output terminal are pulled down to the low level via the pulling-down module, so that the bidirectional pulling-down can be realized. Further, the shift register unit is driven by four clock signal terminals, thus reducing the power consumption of the circuit.

20 Claims, 10 Drawing Sheets

(52) U.S. Cl.
CPC ............... *G09G2300/0426* (2013.01); *G09G 2300/0871* (2013.01); *G09G 2310/0251* (2013.01); *G09G 2310/0286* (2013.01); *G09G 2310/061* (2013.01); *G09G 2310/08* (2013.01)

(56) References Cited

U.S. PATENT DOCUMENTS

| | | |
|---|---|---|
| 2010/0007653 A1 | 1/2010 | Ahn et al. |
| 2012/0327131 A1* | 12/2012 | Jang .................... G09G 3/3266 345/690 |
| 2014/0111495 A1 | 4/2014 | Iwase |
| 2014/0126684 A1 | 5/2014 | Ma et al. |
| 2014/0355733 A1* | 12/2014 | Kim .................... G09G 3/3266 377/67 |
| 2016/0019976 A1* | 1/2016 | Pai ..................... G09G 3/3266 345/204 |
| 2016/0125954 A1* | 5/2016 | Gu ...................... G11C 19/28 377/64 |
| 2016/0133337 A1* | 5/2016 | Gu ...................... G11C 19/28 377/64 |

FOREIGN PATENT DOCUMENTS

| | | |
|---|---|---|
| CN | 102956186 A | 3/2013 |
| CN | 103065592 A | 4/2013 |
| CN | 103236273 A | 8/2013 |
| CN | 103714792 A | 4/2014 |
| KR | 20080058570 A | 6/2008 |
| WO | 2012161042 A1 | 11/2012 |

OTHER PUBLICATIONS

Written Opinion of the International Searching Authority Appln. No. PCT/CN2014/080116; Dated Sep. 30, 2014.
International Search Report and Written Opinion both dated Sep. 30, 2014; PCT/CN2014/080116.

* cited by examiner

SHIFT REGISTER UNIT, GATE DRIVING CIRCUIT AND DISPLAY APPARATUS

TECHNICAL FIELD

The present disclosure relates to a shift register unit, a gate driving circuit and a display apparatus.

BACKGROUND

The Thin Film Transistor-Liquid Crystal Display (TFT-LCD) is formed by a pixel array defined by gate lines and data lines extended in a horizontal direction and a vertical direction respectively. When the TFT-LCD displays an image, a gate driver inputs a square wave in a certain width to each row of pixels via a corresponding gate line from top to bottom sequentially so as to activate the row of pixels, and then a source driver inputs signals required by each row of pixels to the corresponding row of pixels from top to bottom via the data lines sequentially. The higher the resolution is, the more the output signals of the gate driver and the source driver of the display are, and thus the length of the driving circuit is increased, which is disadvantageous for a bonding process of the module driving circuit.

To address the above issues, a circuit design of Gate Driver on Array (GOA) is generally employed in the manufacture of the existing displays, wherein a gate switching circuit of TFTs is integrated on an array substrate of a display panel to achieve a scanning and driving function for the display panel, so that a bonding area for the gate driving circuit and a space for periphery wiring can be omitted, thus achieving a symmetrical structure of both sides and an aesthetic design of narrow bezel of the display panel.

In a design of GOA circuit adopting the Low Temperature Poly-Silicon (LTPS) technology, a GOA circuit of Complementary Metal Oxide Semiconductor can be employed, wherein the TFTs of P type and the TFTs of N type together form an integrated circuit of complementary type. Therefore, characteristics of the TFTs of P type and the TFTs of N type need to be ensured in the procedure of manufacturing the circuit, thus increasing complexities and difficulties of the LTPS process, reducing performance and a yield rate of the TFTs, and in turn increasing production cost.

In order to reduce the production cost, a GOA circuit of MOS transistors of single type is adopted in the existing technology. A GOA unit circuit of NMOS LTPS as illustrated in FIG. 1 possesses features of uni-directional scan (OUT_n−1), a pulling-up control (making a signal output terminal OUT_n output a high level), a uni-directional direct-current pulling-down (pulling-down the signal output terminal OUT_n to a low level) and the like. However, the scope to which the GOA circuit of uni-directional scan can be applied is relatively narrow; moreover, the signal output terminal OUT_n of the GOA circuit is pulled down to the low level only when the transistor M01 is turned on. As a result, when the transistor M01 is turned off in error due to an interference signal, it is impossible to pull down the signal output terminal OUT_n. Thus, reliability of the GOA circuit is decreased in such uni-directional pulling-down manner. Further, two clock signals CLK and CLKB are adopted to drive the above GOA circuit of MOS transistors of single type, and thus, in one operational period of the GOA circuit, there are only two clock signals CLK and CLKB being used to drive the GOA circuit; therefore, a large external driving capability is required for the GOA circuit, causing power consumption of the circuit to be increased and lifespan of the GOA circuit to be reduced.

SUMMARY

According to one aspect of the present disclosure, there is provided a shift register unit comprising a bidirectional scan pre-charging module, a pulling-up module, a pulling-down control module, a reset module and a pulling-down module.

The bidirectional scan pre-charging module is connected to a first signal input terminal, a first voltage terminal, a second signal input terminal, a second voltage terminal and a pulling-up control node, and is configured to control a potential at the pulling-up control node according to signals inputted from the first signal input terminal and the second signal input terminal, wherein the pulling-up control node is a connection point where the bidirectional scan pre-charging module and the pulling-up module are connected.

The pulling-up module is connected to the pulling-up control node, a first clock signal terminal and a signal output terminal, and is configured to allow the signal output terminal to output a signal at the first clock signal terminal under the control of the potential at the pulling-up control node.

The pulling-down control module is connected to a second clock signal terminal, a third clock signal terminal, a fourth clock signal terminal and a pulling-down control node, and is configured to control a potential at the pulling-down control node under the control of signals inputted from the second clock signal terminal, the third clock signal terminal, and the fourth clock signal terminal, wherein the pulling-down control node is a connection point where the pulling-down control module and the pulling-down module are connected.

The reset module is connected to a third signal input terminal and the pulling-down control node, and is configured to control the potential at the pulling-down control node according to a signal inputted from the third signal input terminal, and to reset the potential at the pulling-up control node and an output signal of the signal output terminal under the control of the potential at the pulling-down control node prior to an operation of the shift register unit.

The pulling-down module is connected to the pulling-up control node, the pulling-down control node, a third voltage terminal and the signal output terminal, and is configured to pull down the potential at the pulling-up control node and the output signal of the signal output terminal to a level at the third voltage terminal under the control of the potential at the pulling-down control node.

According to another aspect of the present disclosure, there is provided a gate driving circuit comprising a plurality of stages of the shift register units as described above.

Except a first stage of shift register unit, the first signal input terminal of each stage of shift register units is connected to the signal output terminal of a previous stage of shift register unit adjacent thereto.

Except a last stage of shift register unit, the signal output terminal of each stage of shift register units is connected to the first signal input terminal of a subsequent stage of shift register unit adjacent thereto.

Except the first stage of shift register unit, the signal output terminal of each stage of shift register units is connected to the second signal input terminal of a previous stage of shift register unit adjacent thereto.

Except the last stage of shift register unit, the second signal input terminal of each stage of shift register units is connected to the signal output terminal of a subsequent stage of shift register unit adjacent thereto.

According to a yet aspect of the present disclosure, there is provided a display apparatus comprising the gate driving circuit as described above.

In the shift register unit, the gate driving circuit and the display apparatus provided in the embodiments of the present disclosure, a bidirectional scanning can be achieved in the shift register unit according to different voltage signals inputted from the first signal input terminal and the second signal input terminal of the bidirectional scan pre-charging module, thus expanding the scope to which the gate driving circuit can be applied. Moreover, the potential at the pulling-up control node and the output signal of the signal output terminal are pulled down to the low level via the pulling-down module, so that the shift register unit possesses the feature of bidirectional pulling-down. Further, the shift register unit is driven by four clock signals during one operational period, thus reducing the power consumption of the circuit.

BRIEF DESCRIPTION OF THE DRAWINGS

Hereinafter, a simple introduction will be given to the accompanying drawings as required in the descriptions of the embodiments of the present disclosure or the solution of the prior art; obviously, the accompanying drawings in the following descriptions only illustrate some embodiments of the present invention, and for those skilled in the art, it is possible to obtain other drawings from the accompanying drawings without paying any inventive labors.

DETAILED DESCRIPTION

In the following, the technical solutions of embodiments of the present disclosure will be clearly and completely described in connection with the accompanying drawings. Obviously, the described embodiments are only part of the embodiments of the present disclosure, but not all of them. All other embodiments obtained by those skilled in the art based on the embodiments in the present disclosure without creative work also fall in the protection scope of the present invention.

All transistors employed in all of the embodiments of the present disclosure can be thin film transistors or field effect transistors or other devices having similar properties. Since the source and the drain of the transistor adopted herein are symmetrical, there is no distinction between the source and the drain. In the embodiments of the present disclosure, in order to make distinction between two electrodes of the transistor other than the gate, one of the two electrodes is referred to as the source, and the other is referred to as the drain. Besides, a transistor can be classified into a transistor of N type or a transistor of P type according to the properties of the transistor; in the embodiments of the present disclosure, for a transistor of N type, the first electrode of the transistor can be a source and the second electrode thereof can be a drain; for a transistor of P type, the first electrode of the transistor can be a drain and the second electrode thereof can be a source. Each of the transistors adopted in the embodiments of the present disclosure can be a transistor of N type or a transistor of P type.

Figure 1:
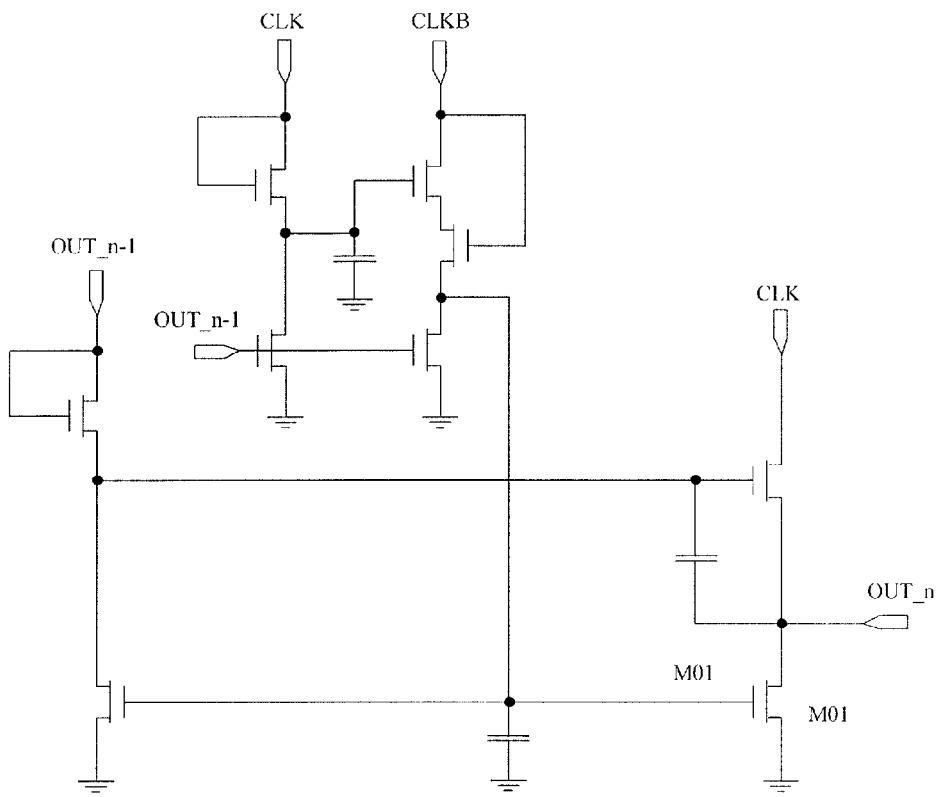
FIG. 1 is a schematic view of a structure of a shift register unit provided in the prior art.
Figure 2:
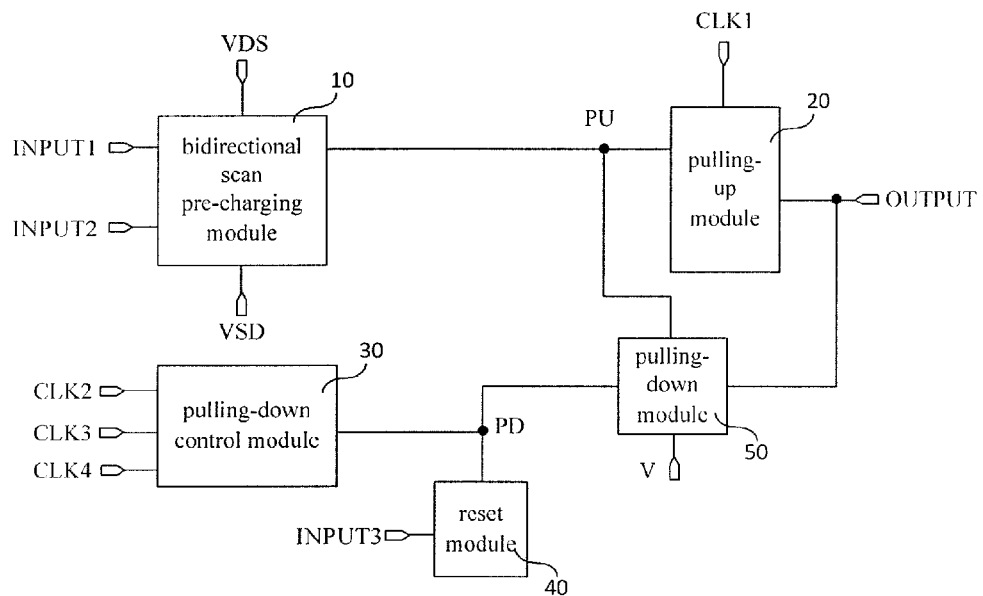
FIG. 2 is a schematic view of a structure of a shift register unit provided in an embodiment of the present disclosure.

FIG. 2 is a schematic diagram illustrating a structure of a shift register unit according to an embodiment of the present disclosure. As illustrated in FIG. 2, the shift register unit comprises a bidirectional scan pre-charging module 10, a pulling-up module 20, a pulling-down control module 30, a reset module 40 and a pulling-down module 50.

The bidirectional scan pre-charging module 10 is connected to a first signal input terminal INPUT1, a first voltage terminal VDS, a second signal input terminal INPUT2, a second voltage terminal VSD and a pulling-up control node PU. The first signal input terminal INPUT1 inputs a signal STV_n−1, and the second signal input terminal INPUT2 inputs a signal STV_n+1. The bidirectional scan pre-charging module 10 is configured to control the potential at the pulling-up control node PU according to signals inputted from the first signal input terminal INPUT1 and the second signal input terminal INPUT2, wherein the pulling-up control node PU is a connection point where the bidirectional scan pre-charging module 10 and the pulling-up module 20 are connected.

The pulling-up module 20 is connected to the pulling-up control node PU, a first clock signal terminal CLK1 and a signal output terminal OUTPUT, and is configured to allow the signal output terminal OUTPUT to output the signal at the first clock signal terminal CLK1 under the control of the potential at the pulling-up control node PU.

The pulling-down control module 30 is connected to a second clock signal terminal CLK2, a third clock signal terminal CLK3, a fourth clock signal terminal CLK4 and a pulling-down control node PD, and is configured to control the potential at the pulling-down control node PD under the control of signals inputted from the second clock signal terminal CLK2, the third clock signal terminal CLK3, and the fourth clock signal terminal CLK4, wherein the pulling-down control node PD is a connection point where the pulling-down control module 30 and the pulling-down module 50 are connected.

The reset module 40 is connected to a third signal input terminal INPUT3 and the pulling-down control node PD, and is configured to control the potential at the pulling-down control node PD according to the signal STV inputted from the third signal input terminal INPUT3, and to reset the potential at the pulling-up control node PU and an output signal of the signal output terminal OUTPUT under the control of the potential of the pulling-down control node PD prior to the operation of the shift register unit.

The pulling-down module 50 is connected to the pulling-up control node PU, the pulling-down control node PD, a third voltage terminal V and the signal output terminal OUTPUT, and is configured to pull down the potential at the pulling-up control node PU and the output signal of the signal output terminal OUTPUT to the level of the third voltage terminal V under the control of the potential of the pulling-down control node PD.

In the shift register unit provided in the embodiment of the present disclosure, a bidirectional scanning can be achieved in the shift register unit according to different voltage signals inputted from the first signal input terminal and the second signal input terminal of the bidirectional scan pre-charging module, thus expanding the scope to which the shift register unit can be applied. Moreover, the potential at the pulling-up control node and the output signal of the signal output terminal are pulled down to the low level via the pulling-down module, so that the shift register unit possesses the feature of bidirectional pulling-down. Further, the shift register unit is driven by four clock signals during one operational period, thus reducing the power consumption of the circuit.

Figure 3:
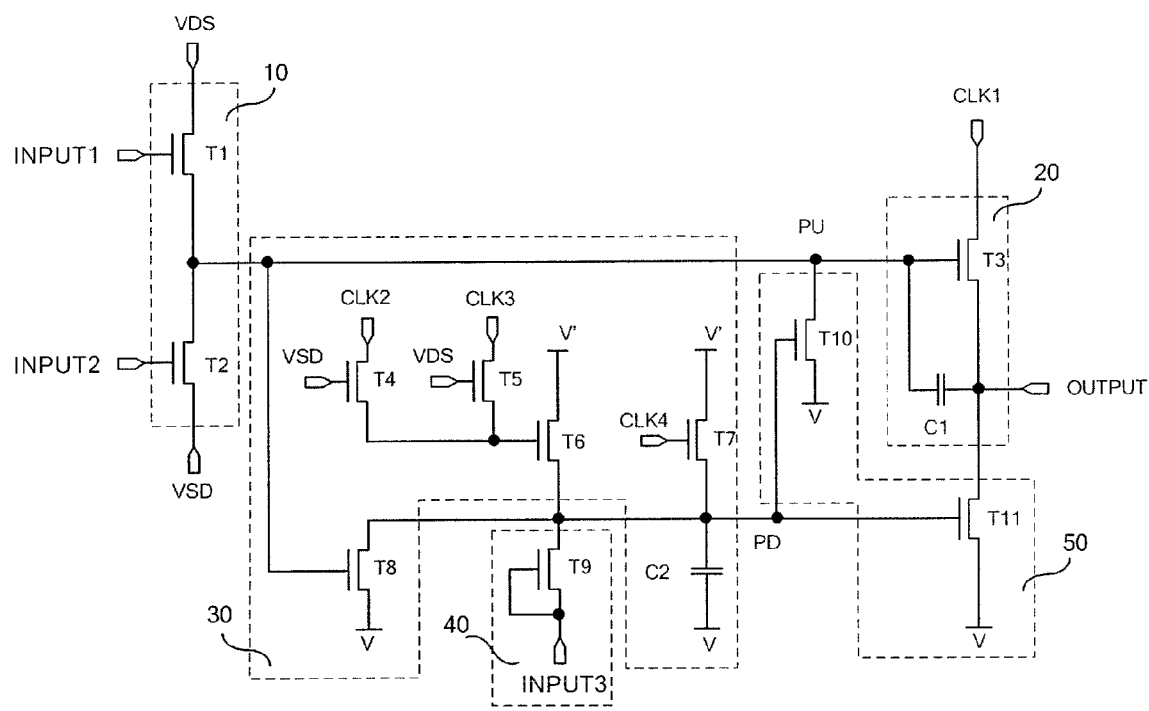
FIG. 3 is a schematic view of a structure of another shift register unit provided in an embodiment of the present disclosure.

Further, as illustrated in FIG. 3, the bidirectional scan pre-charging module 10 comprises a first transistor T1 and a second transistor T2.

The first electrode of the first transistor T1 is connected to the first voltage terminal VDS, the gate thereof is connected to the first signal input terminal INPUT1 for receiving the input signal STV_n−1, and the second electrode thereof is connected to the pulling-up control node PU.

The first electrode of the second transistor T2 is connected to the pulling-up control node PU, the gate thereof is connected to the second signal input terminal INPUT2 for receiving the input signal STV_n+1, and the second electrode thereof is connected to the second voltage terminal VSD.

It should be noted that in the embodiments of the present disclosure, considering a case in which a plurality of shift register units are connected in cascade to form a gate driving circuit, the signal STV is an initial signal inputted into a first stage of shift register unit, the signal STV_n−1 is an output signal of a shift register unit at a stage previous to a present stage of shift register unit, and the signal STV_n+1 is an output signal of a shift register unit at a stage subsequent to the present stage of shift register unit.

Further, the pulling-up module 20 comprises a third transistor T3 and a first capacitor C1.

The first electrode of the third transistor T3 is connected to the first clock signal terminal CLK1, the gate thereof is connected to the pulling-up control node PU, and the second electrode thereof is connected to the signal output terminal OUTPUT.

The first capacitor C1 is connected between the gate and the second electrode of the third transistor T3.

Further, the pulling-down control module 30 comprises a fourth to eighth transistors T4-T8 and a second capacitor C2.

The first electrode of the fourth transistor T4 is connected to the second clock signal terminal CLK2, and the gate thereof is connected to the second voltage terminal VSD.

The first electrode of the fifth transistor T5 is connected to the third clock signal terminal CLK3, and the gate thereof is connected to the first voltage terminal VDS.

The first electrode of the sixth transistor T6 is connected to a fourth voltage terminal V', the gate thereof is connected to the second electrodes of the fourth transistor T4 and the fifth transistor T5, and the second electrode thereof is connected to the pulling-down control node PD.

The first electrode of the seventh transistor T7 is connected to the fourth voltage terminal V', the gate thereof is connected to the fourth clock signal terminal CLK4, and the second electrode thereof is connected to the pulling-down control node PD.

The first electrode of the eighth transistor T8 is connected to the pulling-down control node PD, the gate thereof is connected to the pulling-up control node PU, and the second electrode thereof is connected to the third voltage terminal V.

One terminal of the second capacitor C2 is connected to the second electrode of the seventh transistor T7, and the other terminal of the second capacitor C2 is connected to the third voltage terminal V.

Further, the reset module 40 comprises a ninth transistor T9, wherein the first electrode of the ninth transistor T9 is connected to the second electrode of the sixth transistor T6, the gate and the second electrode of the ninth transistor T9 are connected to the third signal input terminal INPUT3.

Further, the pulling-down module 50 comprises a tenth transistor T10 and an eleventh transistor T11.

The first electrode of the tenth transistor T10 is connected to the pulling-up control node PU, the gate thereof is connected to the pulling-down control node PD, and the second electrode thereof is connected to the third voltage terminal V.

The first electrode of the eleventh transistor T11 is connected to the signal output terminal OUTPUT, the gate thereof is connected to the pulling-down control node PD, and the second electrode thereof is connected to the third voltage terminal V.

Hereinafter, an explanation is given by taking a case in which the shift register unit has the structure illustrated in FIG. 3 and all of the transistors therein are transistors of N type as an example, and a detailed description is given to the operational procedure of the shift register unit with reference to the timing sequence diagram for scanning of the shift register unit.

It should be noted that the third voltage terminal V and the fourth voltage terminal V' can be grounding terminals, or can be configured to input a low level VSS or VGL; as an alternative, the third voltage terminal V and the fourth voltage terminal V' can be configured to input a high level Vdd or VGH. Since in the present embodiment, a case in which transistors of N type are adopted is taken as an example for illustration, hereinafter, a case in which the third voltage terminal V is configured to input a low level VGL and the fourth voltage terminal V' is configured to input a high level VGH is taken as an example for illustration.

Figure 4A:
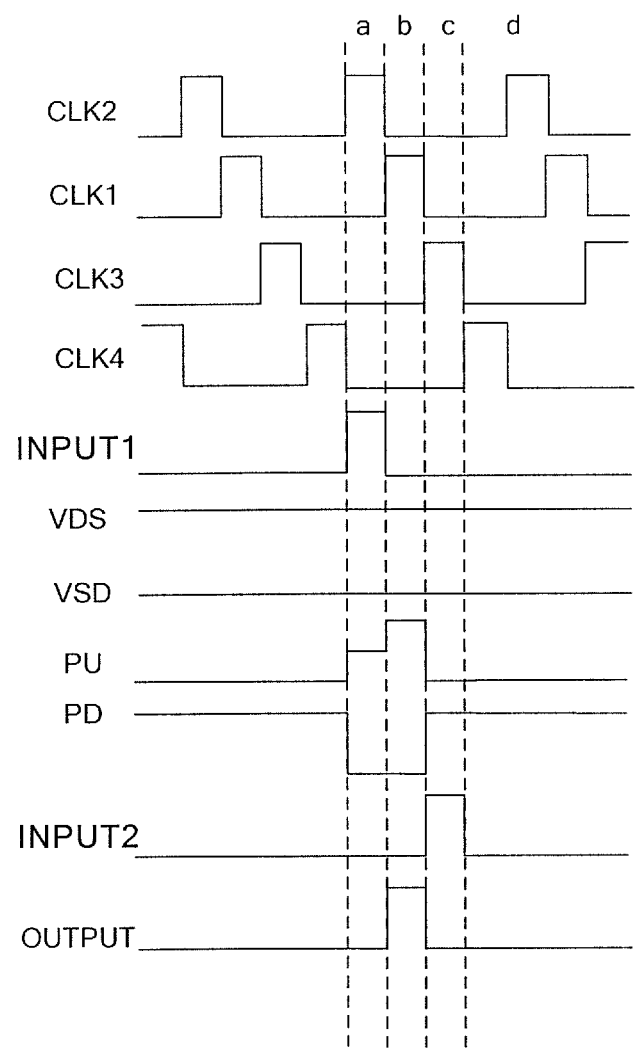
FIG. 4a is a waveform diagram of timing sequences of signals in a shift register unit in operation which is provided in an embodiment of the present disclosure.

When the first voltage terminal VDS is at a high level VGH and the second voltage terminal VSD is at a low level VGL, the shift register unit is in a forward scanning status, and the timing sequence diagram for scanning of the shift register unit is illustrated in FIG. 4a.

Before the operation of the shift register unit, the third signal input terminal INPUT3 inputs a high level; the initial signal STV of the gate driving circuit can be selected as the signal inputted from the third signal input terminal INPUT3. The potential at the pulling-down control node PD is increased to a high level due to the high level inputted from the third signal input terminal INPUT3, and in turn the tenth transistor T10 and the eleventh transistor T11 are turned on, so as to reset the potential at the pulling-up control node PU and the potential at the signal output terminal OUTPUT to a low level, so that the shift register unit can operate normally. It is avoided that the signal output terminal OUTPUT changes to a high level under the effect of other interference signals and in turn a gate line for a row, which is controlled by the signal output terminal OUTPUT, is activated due to the high level, thus preventing the gate line from being activated in error. During other phases, the signal STV inputted from the third signal input terminal INPUT3 is at a low level. Thus, this phase can be referred to as a resetting phase.

During a phase a: CLK1=0; CLK2=1; CLK3=0; CLK4=0; STV_n−1=1; PU=1; PD=0; STV_n+1=0; OUTPUT=0. It should be noted that 0 represents a low level VGL, and 1 represents a high level VGH in the following embodiments.

Figure 5:
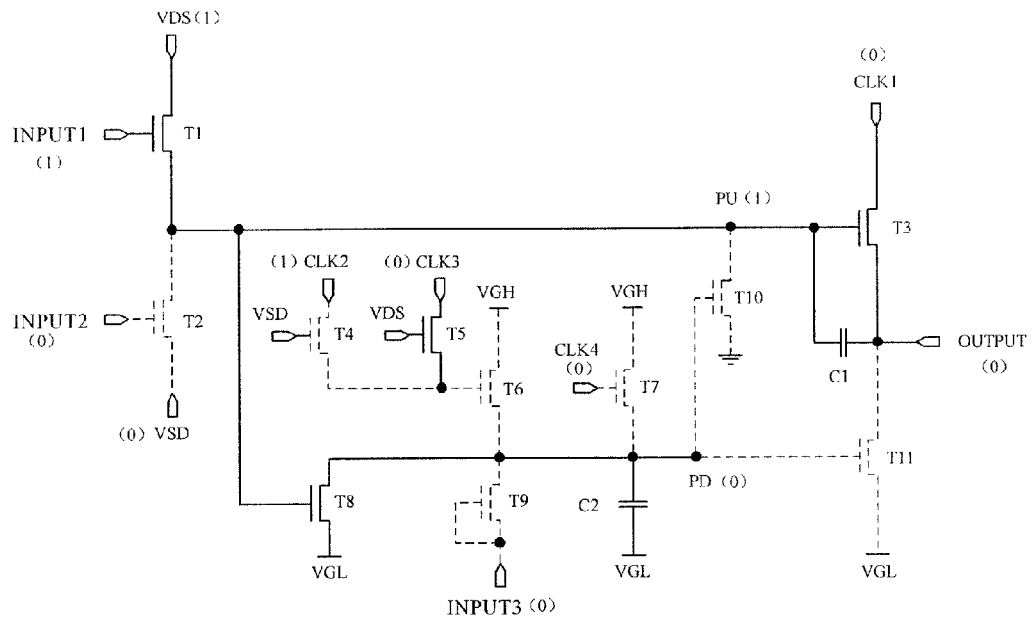
FIGS. 5-8 are schematic diagrams illustrating operational status of a shift register unit which is provided in an embodiment of the present disclosure.

As illustrated in FIG. 5, the signal STV_n−1 inputted from the first signal input terminal INPUT1 is at a high level, the pre-charging transistor (i.e., the first transistor T1) is turned on, and the potential at the pulling-up control node PU is increased to the high level VGH. Since the fourth transistor T4 is turned off, and the fifth transistor T5 is turned on, the sixth transistor T6 is turned off due to a low level received at the gate thereof, wherein the low level is inputted from the third clock signal terminal CLK3. Since the fourth clock signal terminal CLK4 connected to the gate of the seventh transistor T7 is at a low level, the seventh transistor T7 is turned off. Since the potential at the pulling-up control node PU connected to the gate of the eighth transistor T8 is a high level, the eighth transistor T8 is turned on, and the potential at the pulling-down control node PD connected to the second capacitor C2 is discharged and pulled down to a low level, so that the tenth transistor T10 and the eleventh transistor T11 are turned off. The signal STV inputted from the third signal input terminal INPUT3 is at a low level, so that the ninth transistor T9 is turned off. In summary, the phase a is a pre-charging phase for the first capacitor C1 of the shift register unit, wherein the voltage across the first capacitor C1 is pre-charged to VGH-VGL.

During a phase b: CLK1=1; CLK2=0; CLK3=0; CLK4=0; STV_n−1=0; PU=1; PD=0; STV_n+1=0; OUTPUT=1.

Figure 6:
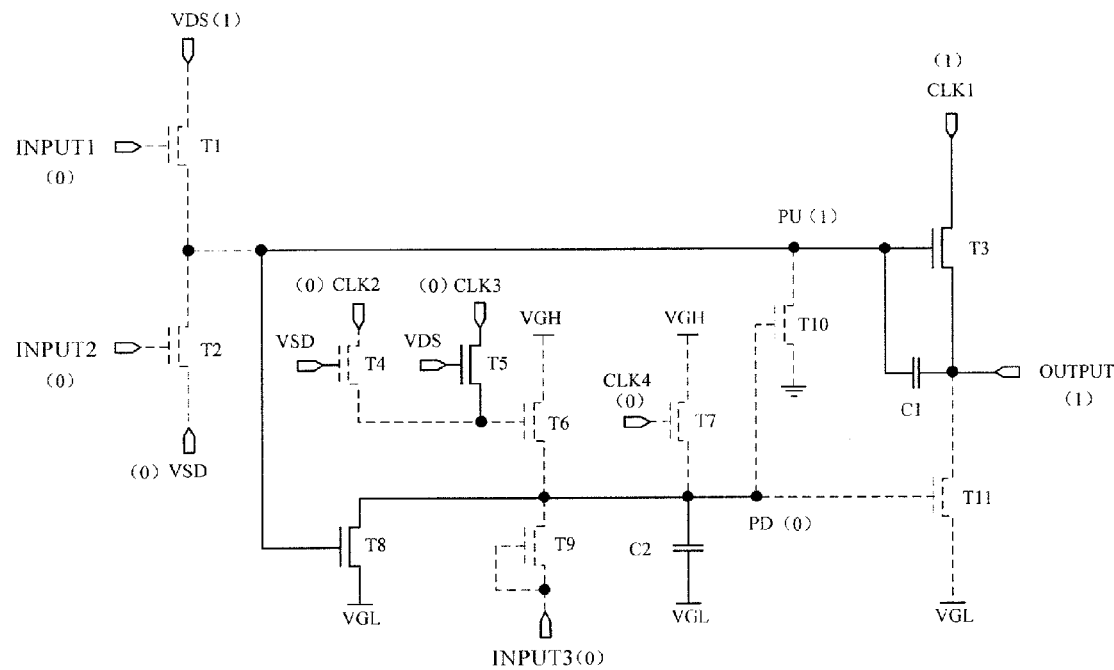

As illustrated in FIG. 6, the signal STV_n−1 inputted from the first signal input terminal INPUT1 is at a low level, and the first transistor T1 is turned off. Since the third clock signal terminal CLK3 and the fourth clock signal terminal CLK4 are still at a low level, the sixth transistor T6 and the seventh transistor T7 are still off. Since the pulling-up control node PU is at a high level, the eighth transistor T8 is still on. The pulling-down control node PD is kept at the low level VGL, and the tenth transistor T10 and the eleventh transistor T11 are turned off. The voltage across the first capacitor C1 is kept at VGH-VGL. Since the first clock signal terminal CLK1 changes from a low level to the high level VGH, the high potential at the pulling-up control node PU is increased to a higher level 2VGH-VGL due to the voltage coupling effect of the first capacitor C1, and the higher level at the pulling-up control node PU also controls the third transistor T3 to be turned on, so that the signal output terminal OUTPUT outputs a high level. In summary, the phase b is an outputting phase for the shift register unit.

During a phase c: CLK1=0; CLK2=0; CLK3=1; CLK4=0; STV_n−1=0; PU=0; PD=1; STV_n+1=1; OUTPUT=0.

Figure 7:
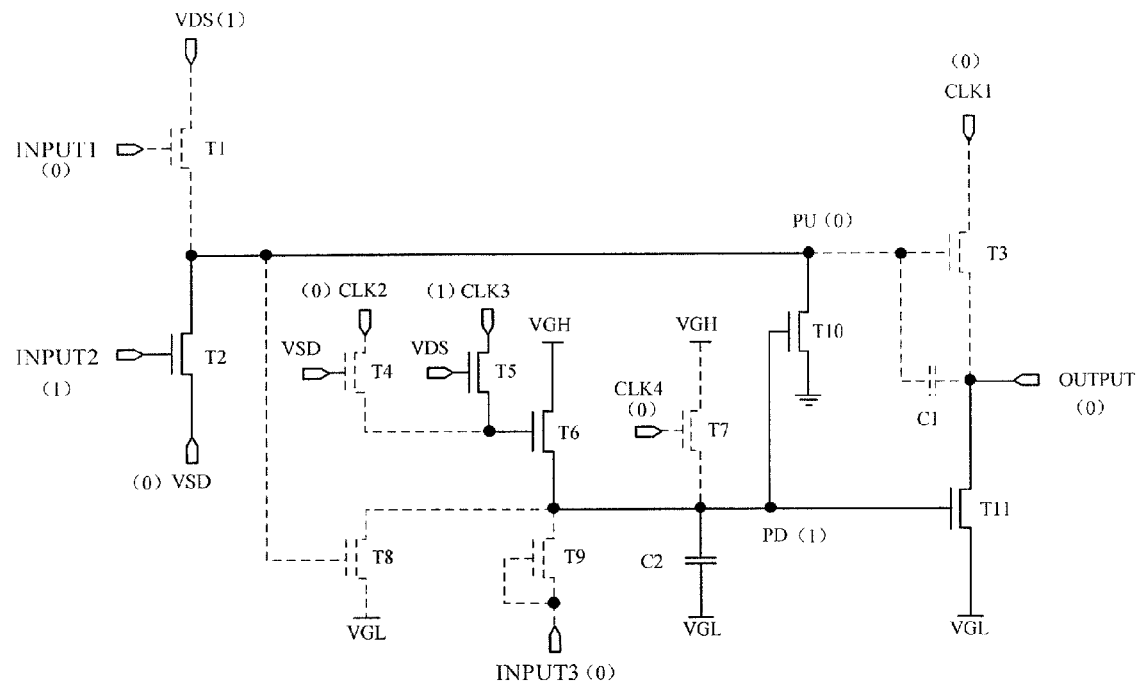

As illustrated in FIG. 7, the signal STV_n+1 inputted from the second signal input terminal INPUT2 is at a high level, the second transistor T2 is turned on, and the potential at the pulling-up control node PU is pulled down to the low level VGL, so that the eighth transistor T8 is turned off. Since the fourth clock signal terminal CLK4 is still at a low level, the seventh transistor T7 is turned off. The third clock signal terminal CLK3 outputs a high level, so that the sixth transistor T6 is turned on; thus, the potential at the pulling-down control node PD changes to the high level VGH, so that the voltage across the second capacitor C2 is charged to VGH-VGL. Under the control of the high potential at the pulling-down control node PD, the tenth transistor T10 and the eleventh transistor T11 are turned on. The signal outputted from the signal output terminal OUTPUT is pulled down to the low level VGL via the eleventh transistor T11, and the potential at the pulling-up control node PU is pulled down to the low level VGL via the tenth transistor T10. Thus, the phase c is a pulling-down phase for the shift register unit.

During a phase d: CLK4, CLK2, CLK1 and CLK3 are at a high level in sequence, and STV_n−1=0; PU=0; PD=1; STV_n+1=0; OUTPUT=0.

Figure 8:
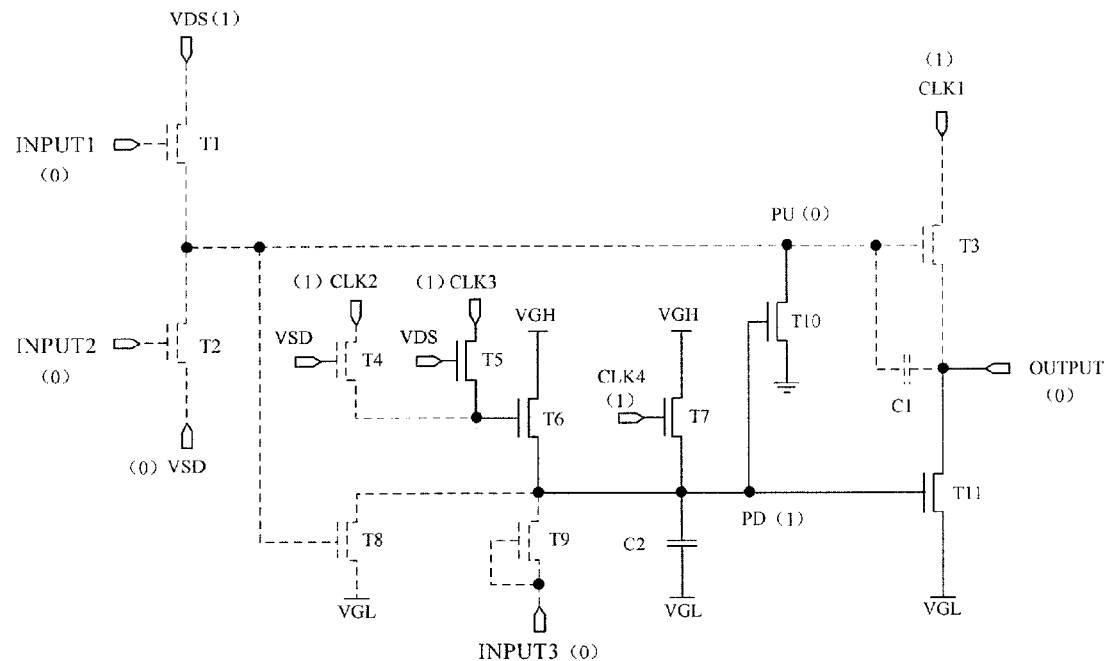

As illustrated in FIG. 8, the signal STV_n−1 inputted from the first signal input terminal INPUT1 and the signal STV_n+1 inputted from the second signal input terminal INPUT2 are both at the low level VGL; thus, the first transistor T1 and the second transistor T2 are kept off.

When the fourth clock signal terminal CLK4 is at a high level and the first to third clock signal terminals CLK1-CLK3 are all at the low level, the seventh transistor T7 is turned on, so that the second capacitor C2 is charged to VGH-VGL.

When the third clock signal terminal CLK3 is at a high level and the first, second and fourth clock signal terminals CLK1, CLK2 and CLK4 are all at the low level, the sixth transistor T6 is turned on, so that the second capacitor C2 is charged to VGH-VGL.

When the first clock signal terminal CLK1 is at a high level and the second to fourth clock signal terminals CLK2-CLK4 are all at the low level, or when the second clock signal terminal CLK2 is at a high level and the first, third and fourth clock signal terminals CLK1, CLK3 and CLK4 are all at the low level, the pulling-down control node PD is kept at a high level by means of the second capacitor C2.

Therefore, during the phase d, it is achieved by the sixth transistor T6, the seventh transistor T7 and the second capacitor C2 that the pulling-down control node PD is maintained at the high level VGH. The high potential at the pulling-down control node PD allows the tenth transistor T10 and the eleventh transistor T11 to be turned on continuously, so that it is realized that the signal output terminal OUTPUT and the pulling-up control node PU are pulled down in a direct current mode. It is avoided that the signal output terminal OUTPUT changes to a high level under the effect of other interference signals and in turn a gate line corresponding to a row, which is controlled by the signal output terminal OUTPUT, is activated due to the high level, thus preventing the gate line from being activated in error.

Figure 4B:
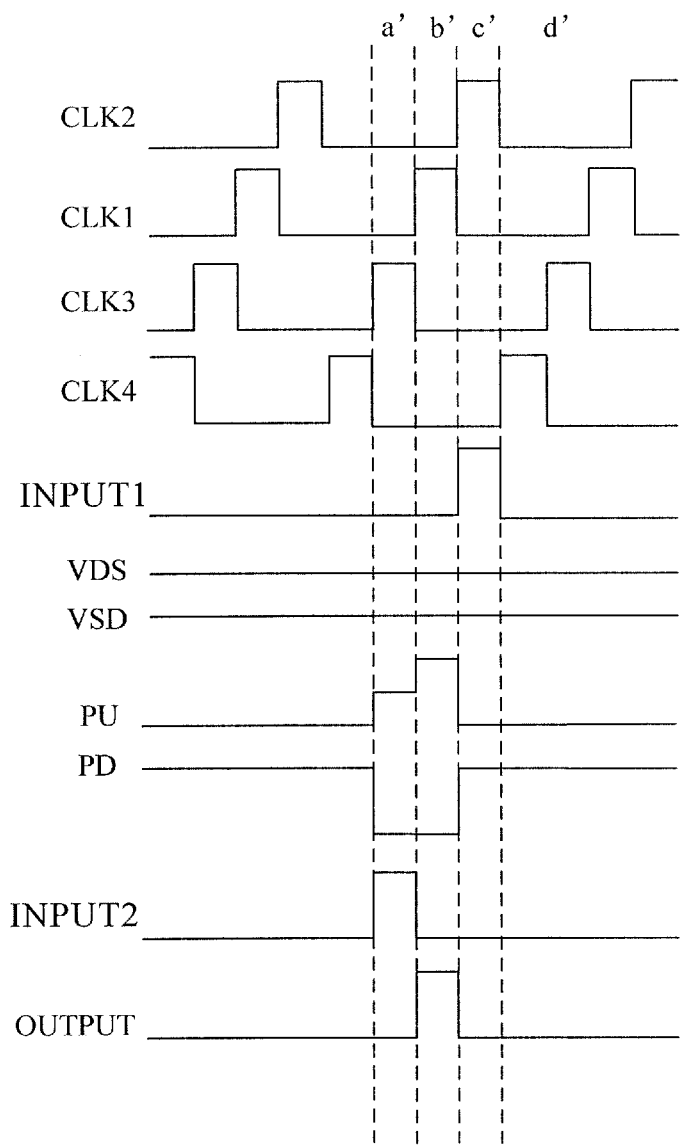
FIG. 4b is a waveform diagram of timing sequences of signals in another shift register unit in operation which is provided in an embodiment of the present disclosure.

When the first voltage terminal VDS is at the low level VGL and the second voltage terminal VSD is at the high level VGH, the shift register unit is in a backward scanning status, and the timing sequence diagram for scanning of the shift register unit is illustrated in FIG. 4b.

During a phase a': CLK1=0; CLK2=0; CLK3=1; CLK4=0; STV_n−1=0; PU=1; PD=0; STV_n+1=1; OUTPUT=0.

Figure 9:
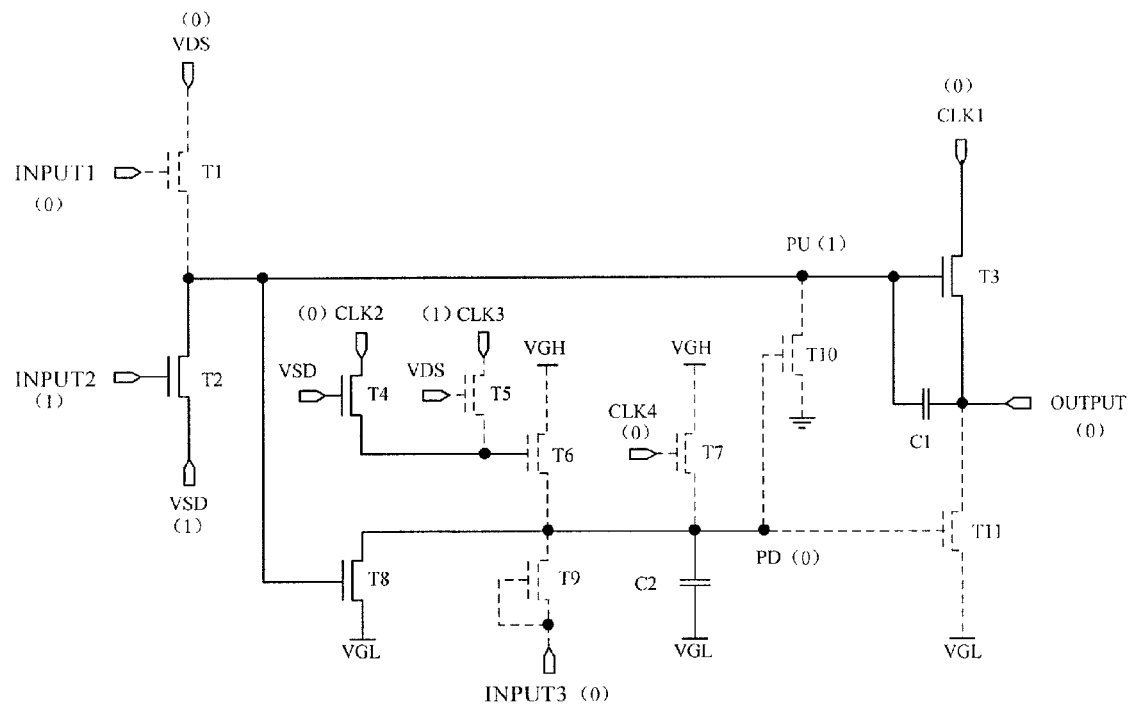
FIGS. 9-11 are schematic diagrams illustrating operational status of another shift register unit which is provided in an embodiment of the present disclosure.

As illustrated in FIG. 9, the signal STV_n+1 inputted from the second signal input terminal INPUT2 is at a high level, the pre-charging transistor (i.e., the second transistor T2) is turned on, and the pulling-up control node PU is charged to the high level VGH due to the high level VSD. Since the fifth transistor T5 is turned off and the fourth transistor T4 is turned on, the sixth transistor T6 is turned off since the second clock signal terminal CLK2 connected to the gate of the sixth transistor T6 is at a low level. Since the fourth clock signal terminal CLK4 connected to the gate of the seventh transistor T7 is at a low level, the seventh transistor T7 is turned off. Since the potential at the pulling-up control node PU connected to the gate of the eighth transistor T8 is at a high level, the eighth transistor T8 is turned on, and the potential at the pulling-down control node PD connected to the second capacitor C2 is pulled down to a low level, so that the tenth transistor T10 and the eleventh transistor T11 are turned off. In summary, the phase a' is a pre-charging phase for the first capacitor C1 of the shift register unit, the voltage across the first capacitor C1 is pre-charged to VGH-VGL.

During a phase b': CLK1=1; CLK2=0; CLK3=0; CLK4=0; STV_n−1=0; PU=1; PD=0; STV_n+1=0; OUTPUT=1.

As illustrated in FIG. 6, the signal STV_n+1 inputted from the second signal input terminal INPUT2 is at a low level, and the second transistor T2 is turned off. Since the second clock signal terminal CLK2 and the fourth clock signal terminal CLK4 still input a low level, the sixth transistor T6 and the seventh transistor T7 are still off. Since the potential at the pulling-up control node PU is at a high level, the eighth transistor T8 is still on. The potential at the pulling-down control node PD is still kept at the low level VGL, and the tenth transistor T10 and the eleventh transistor T11 are still off. The voltage across the first capacitor C1 is kept at VGH-VGL. Since the first clock signal terminal CLK1 changes from a low level to the high level VGH, the high potential of the pulling-up control node is coupled to a higher level 2VGH-VGL via the first capacitor C1, and the higher level at the pulling-up control node PU controls the third transistor T3 to be turned on, so that the signal output terminal OUTPUT outputs a high level. In summary, the phase b' is the outputting phase for the shift register unit.

During a phase c': CLK1=0; CLK2=1; CLK3=0; CLK4=0; STV_n−1=1; PU=0; PD=1; STV_n+1=0; OUTPUT=0.

Figure 10:
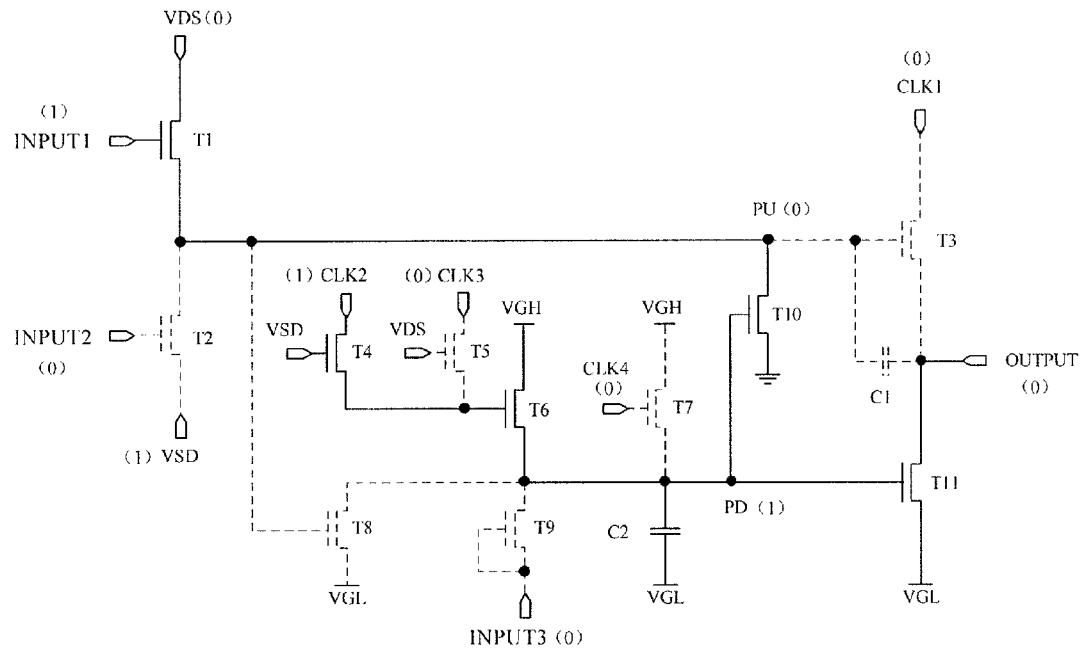

As illustrated in FIG. 10, the signal STV_n−1 inputted from the first signal input terminal INPUT1 is at a high level, the first transistor T1 is turned on, and the potential at the pulling-up control node PU is pulled down to the low level VGL, so that the eighth transistor T8 is turned off. Since the fourth clock signal terminal CLK4 is still at a low level, the seventh transistor T7 is still off. Since the second clock signal terminal CLK2 changes to a high level, the sixth transistor T6 is turned on, and the second capacitor C2 is charged, so that the voltage across the second capacitor C2 is charged to VGH-VGL, and the potential at the pulling-down control node PD changes to the high level VGH. Thereby, the tenth transistor T10 and the eleventh transistor T11 are turned on. The signal outputted from the signal output terminal OUTPUT is pulled down to the low level VGL via the eleventh transistor T11, and the potential at the pulling-up control node PU is pulled down to the low level VGL via the tenth transistor T10 so as to realize the pulling-down function. Thus, the phase c' is the pulling-down phase for the shift register unit.

During a phase d': CLK4, CLK3, CLK1 and CLK2 are at a high level in sequence, and STV_n−1=0; PU=0; PD=1; STV_n+1=0; OUTPUT=0.

Figure 11:
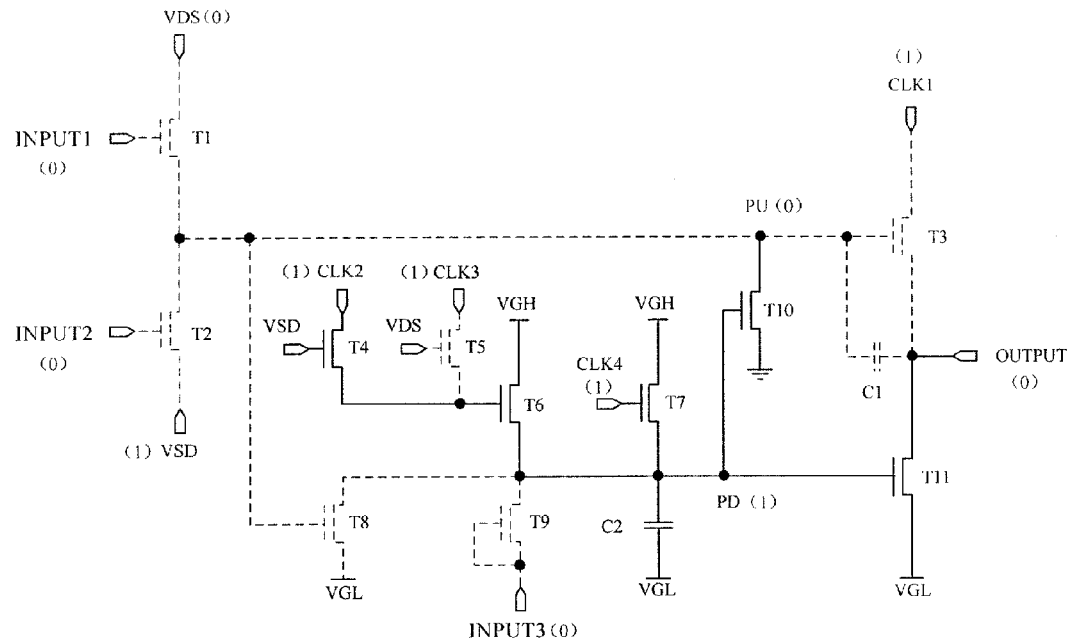

As illustrated in FIG. 11, the signal STV_n−1 inputted from the first signal input terminal INPUT1 and the signal STV_n+1 inputted from the second signal input terminal INPUT2 are both at the low level VGL, and the first transistor T1 and the second transistor T2 are kept off.

When the fourth clock signal terminal CLK4 is at a high level and the first to third clock signal terminals CLK1-CLK3 are all at the low level, the seventh transistor T7 is turned on, so that the voltage across the second capacitor C2 is charged to VGH-VGL.

When the second clock signal terminal CLK2 is at a high level and the first, third and fourth clock signal terminals CLK1, CLK3 and CLK4 are all at the low level, the sixth transistor T6 is turned on, so that the voltage across the second capacitor C2 is charged to VGH-VGL.

When the first clock signal terminal CLK1 is at a high level and the second to fourth clock signal terminals CLK2-CLK4 are all at the low level, or when the third clock signal terminal CLK3 is at a high level and the first, second and fourth clock signal terminals CLK1, CLK2 and CLK4 are all at the low level, the pulling-down control node PD is kept at a high level by means of the second capacitor C2.

Therefore, during the phase d', it is achieved by the sixth transistor T6, the seventh transistor T7 and the second capacitor C2 that the potential at the pulling-down control node PD is maintained at the high level VGH. The high potential at the pulling-down control node PD allows the tenth transistor T10 and the eleventh transistor T11 to be turned on continuously, so that it is realized that the signal output terminal OUTPUT and the pulling-up control node PU are pulled down in a direct current mode. It is avoided that the signal output terminal OUTPUT changes to a high level under the effect of other interference signals and in turn a gate line corresponding to a row, which is controlled by the signal output terminal OUTPUT, is activated due to the high level, thus preventing the gate line from being activated in error.

Figure 12:
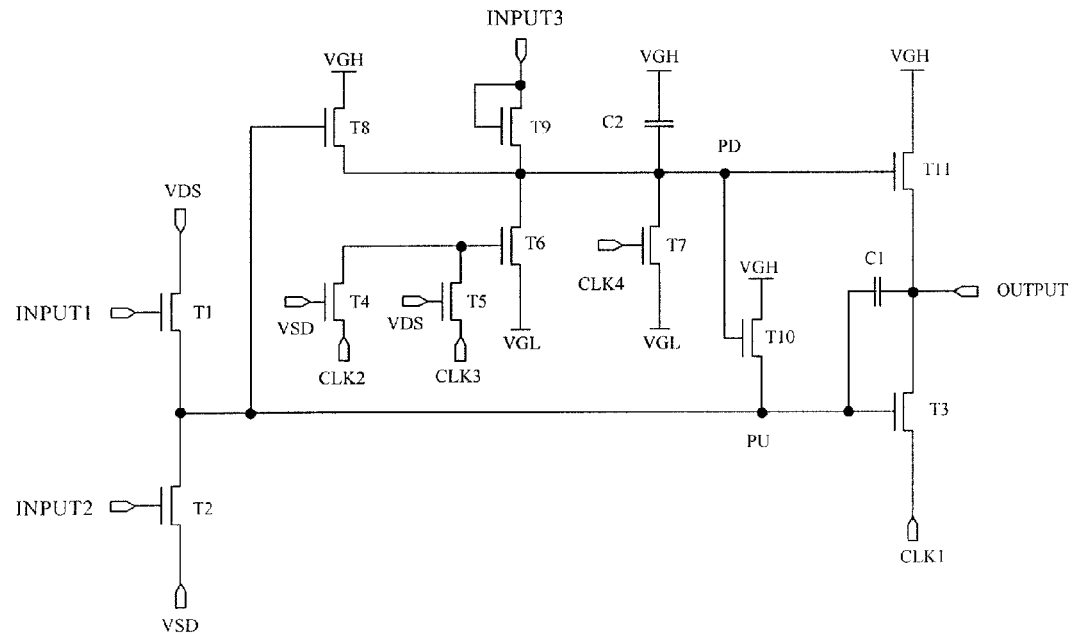
FIG. 12 is a schematic view of a structure of another shift register unit provided in an embodiment of the present disclosure.

In the above embodiments, the description is given by taking the case in which the transistors of N type are adopted as the transistors in the shift register unit as an example, and a configuration of a shift register unit adopting transistors of P type is illustrated in FIG. 12. The detailed operational procedure can be referred to the operational principle of the above shift register unit formed by the transistors of N type, and the timing sequence of the driving signals needs to be adjusted accordingly, and the details are omitted herein.

Figure 13:
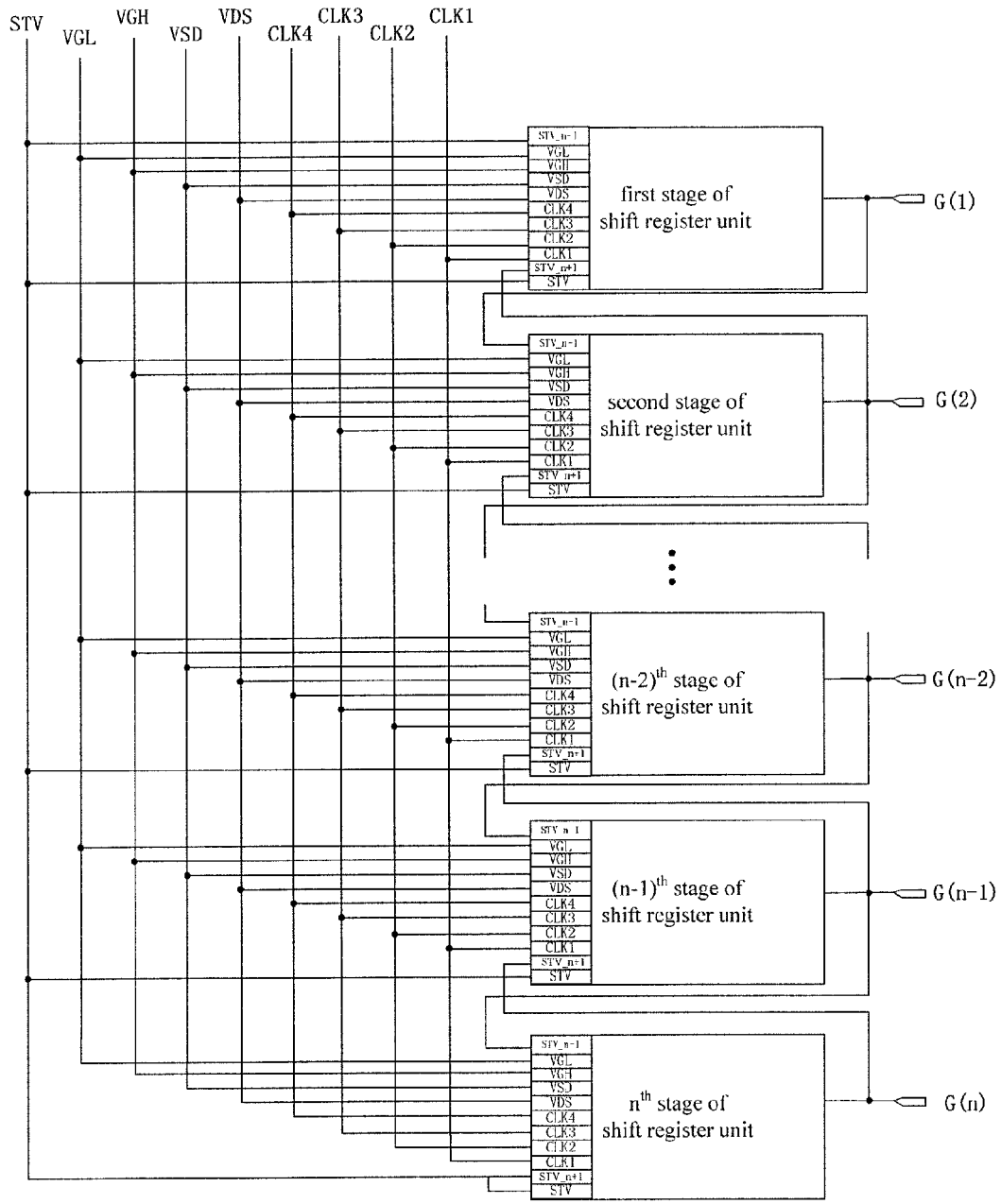
FIG. 13 is a schematic view of a structure of a gate driving circuit provided in an embodiment of the present disclosure.

FIG. 13 illustrates a schematic block diagram of a gate driving circuit provided in an embodiment of the present disclosure. As illustrated in FIG. 13, the gate driving circuit comprises a plurality of stages of the shift register units as described above. In FIG. 13, five shift register units are taken as examples for description, i.e., a first stage of shift register unit, a second stage of shift register unit, a $(n-2)^{th}$ stage of shift register unit, a $(n-1)^{th}$ stage of shift register unit and a $n^{th}$ stage of shift register unit.

Each stage of shift register unit outputs a row scan signal G at its output terminal OUTPUT; each stage of shift register unit comprises a first clock signal terminal CLK1, a second clock signal terminal CLK2, a third clock signal terminal CLK3 and a fourth clock signal terminal CLK4.

Except the first stage of shift register unit, the first signal input terminal of each stage of shift register unit is connected to the signal output terminal OUTPUT of a previous stage of shift register unit adjacent thereto.

Except the last stage of shift register unit, the signal output terminal of each stage of shift register unit is connected to the first signal input terminal of a subsequent stage of shift register unit adjacent thereto.

Further, except the first stage of shift register unit, the signal output terminal of each stage of shift register unit is connected to the second signal input terminal of a previous stage of shift register unit adjacent thereto.

Except the last stage of shift register unit, the second signal input terminal of each stage of shift register unit is connected to the signal output terminal OUTPUT of a subsequent stage of shift register unit adjacent thereto.

The first signal input terminal of the first stage of shift register unit is connected to the initial signal STV of the gate driving circuit, and the second signal input terminal of the last stage of shift register unit is connected to the initial signal STV of the gate driving circuit.

Figure 14A:
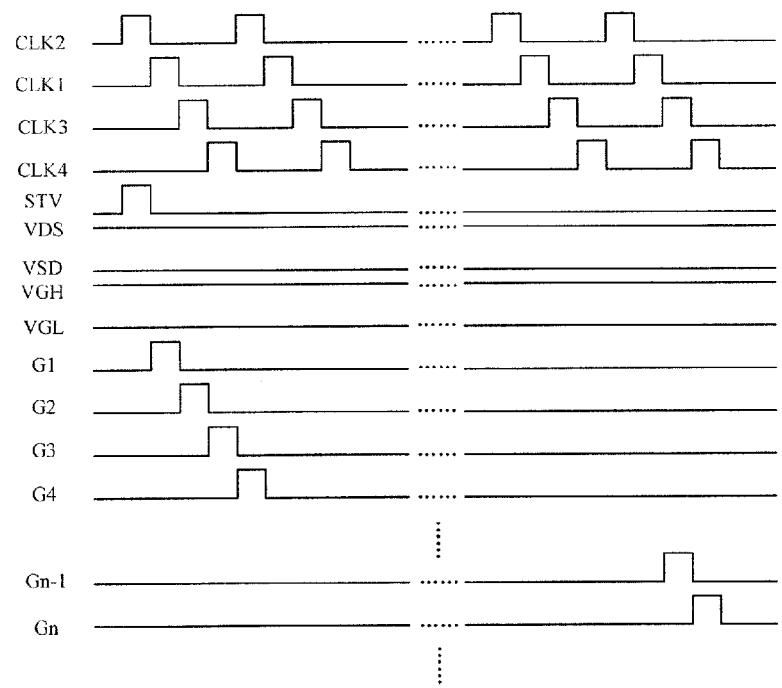
FIG. 14a is a waveform diagram of timing sequences of signals in a gate driving circuit in operation which is provided in an embodiment of the present disclosure.
Figure 14B:
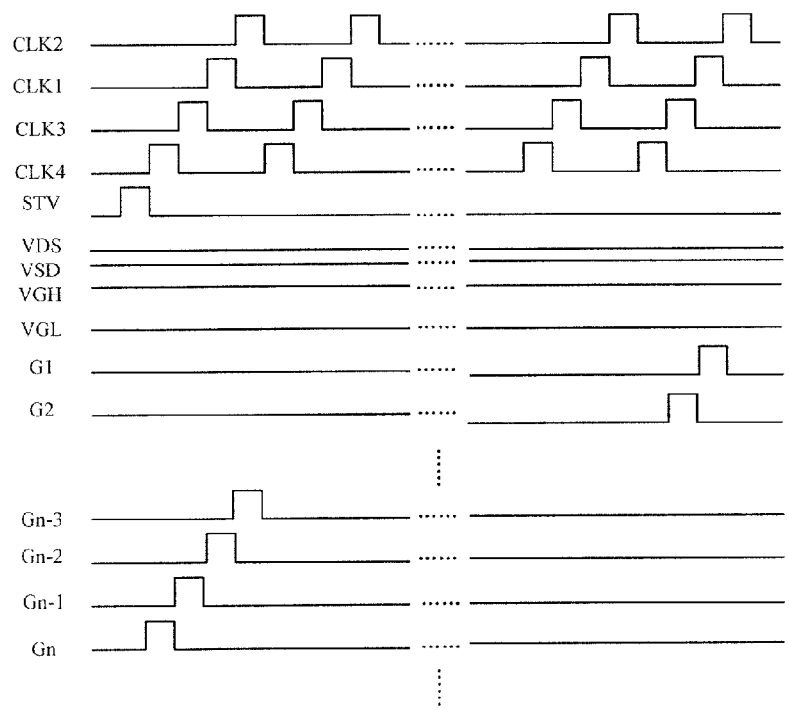
FIG. 14b is a waveform diagram of timing sequences of signals in another gate driving circuit in operation which is provided in an embodiment of the present disclosure.

In particular, when the gate driving circuit performs a forward scanning, the timing sequence of the respective signals is illustrated in FIG. 14a, wherein the respective row scan signals of the GOA circuit are denoted as G1, G2, G3, G4, . . . , Gn−1 and Gn; when the gate driving circuit performs a backward scanning, the timing sequence of the respective signals is illustrated in FIG. 14b wherein the respective row scan signals of the GOA circuit are denoted as Gn, Gn−1, Gn−2, Gn−3, . . . , G2 and G1. The third signal input terminal INPUT3 inputs the initial signal STV of the gate driving circuit so as to reset all of the shift register units.

In the forward scanning, a signal outputted from a present stage of GOA unit serves as a reset signal of a previous stage of GOA unit, and a signal outputted from the previous stage of GOA unit serves as a trigger signal of the present stage of GOA unit. In the backward scanning, the signal outputted from the present stage of GOA unit serves as the trigger signal of the previous stage of GOA unit, and the signal outputted from the previous stage of GOA unit serves as the reset signal of the present stage of GOA unit. The first signal input terminal INPUT3 of each stage of GOA unit is connected to the initial signal input terminal of the gate driving circuit, and the pulling-down control node in the whole GOA circuit is charged once when each frame starts so as to increase the potential at the pulling-down control node to VGH.

As described above, the gate driving circuit provided in the embodiments of the present disclosure comprises a plurality stage of shift register units each comprising a bidirectional scan pre-charging module, a pulling-up module, a pulling-down control module, a reset module and a pulling-down module. Thus, a bidirectional scanning can be achieved in the shift register unit according to different voltage signals inputted from the first signal input terminal and the second signal input terminal of the bidirectional scan pre-charging module, thus expanding the scope to which the gate driving circuit can be applied. The potential at the pulling-up control node and the signal at the signal output terminal are pulled down to a low level via the pulling-down module, so that the shift register unit possesses the feature of bidirectional pulling-down. Further, the shift register unit is driven by four clock signals during one operational period, thus reducing the power consumption of the circuit.

In an embodiment of the present disclosure, there is further provided a display apparatus comprising any one of the gate driving circuits as described above and can achieve the same beneficial effect as the gate driving circuit provided in the above embodiments of the present disclosure. Since the gate driving circuit is described in detail as above, and the details of the display apparatus are omitted herein.

The display apparatus can be any liquid crystal display product or means having a display function, such as a liquid crystal display, a liquid crystal TV set, a digital photo frame, a mobile phone, a tablet computer and the like.

Those ordinary skilled in the art can clearly understand that all or part of steps implementing the above method embodiments of the present disclosure can be implemented through program instructing related hardware. The program may be stored in a computer readable storage medium, and the steps in the above method embodiments of the present disclosure are performed when the program is executed. The computer readable storage medium may include various media capable of storing program codes, for example, a ROM/RAM, a magnetic disk, an optical disk, and so on.

The above descriptions are only for illustrating the embodiments of the present disclosure, and in no way limit the scope of the present disclosure. It will be obvious that variations or alternatives in the technical scope disclosed in the embodiments of the present disclosure, which are easily conceived by those skilled in the art, are intended to be covered within the protection scope of the present disclosure. Therefore, the protection scope of the present invention should be defined according to the attached claims.

The present application claims the priority of a Chinese application with an application No. 201310713643.6 and the invention tile of "Shift Register Unit, Gate Driving Circuit and Display Apparatus", filed on Dec. 20, 2013, and the disclosure of which is entirely incorporated herein by reference.

What is claimed is:

1. A shift register unit comprising a bidirectional scan pre-charging module, a pulling-up module, a pulling-down control module, a reset module and a pulling-down module;
   wherein the bidirectional scan pre-charging module is connected to a first signal input terminal, a first voltage terminal, a second signal input terminal, a second voltage terminal and a pulling-up control node, and is configured to control a potential at the pulling-up control node according to signals inputted from the first signal input terminal and the second signal input terminal, wherein the pulling-up control node is a connection point where the bidirectional scan pre-charging module and the pulling-up module are connected;
   the pulling-up module is connected to the pulling-up control node, a first clock signal terminal and a signal output terminal, and is configured to allow the signal output terminal to output a signal at the first clock signal terminal under the control of the potential at the pulling-up control node;
   the pulling-down control module is connected to a second clock signal terminal, a third clock signal terminal, a fourth clock signal terminal and a pulling-down control node, and is configured to control a potential at the pulling-down control node under the control of signals inputted from the second clock signal terminal, the third clock signal terminal, and the fourth clock signal terminal, wherein the pulling-down control node is a connection point where the pulling-down control module and the pulling-down module are connected;
   the reset module is connected to a third signal input terminal and the pulling-down control node, and is configured to control the potential at the pulling-down control node according to a signal inputted from the third signal input terminal, and to reset the potential at the pulling-up control node and an output signal of the signal output terminal under the control of the potential at the pulling-down control node prior to an operation of the shift register unit; and the pulling-down module is connected to the pulling-down control node, the pulling-up control node, a third voltage terminal and the signal output terminal, and is configured to pull down the potential at the pulling-up control node and the output signal of the signal output terminal to a level at the third voltage terminal under the control of the potential at the pulling-down control node.

2. The shift register unit according to claim 1, wherein the bidirectional scan pre-charging module comprises:
a first transistor having a first electrode connected to the first voltage terminal, a gate connected to the first signal input terminal, and a second electrode connected to the pulling-up control node;
a second transistor having a first electrode connected to the pulling-up control node, a gate connected to the second signal input terminal, and a second electrode connected to the second voltage terminal.

3. The shift register unit according to claim 1, wherein the pulling-up module comprises:
a third transistor having a first electrode connected to the first clock signal terminal, a gate connected to the pulling-up control node, and a second electrode connected to the signal output terminal; and
a first capacitor connected between the gate and the second electrode of the third transistor.

4. The shift register unit according to claim 1, wherein the pulling-down control module comprises:
a fourth transistor having a first electrode connected to the second clock signal terminal, and a gate connected to the second voltage terminal;
a fifth transistor having a first electrode connected to the third clock signal terminal, and a gate connected to the first voltage terminal;
a sixth transistor having a first electrode connected to a fourth voltage terminal, a gate connected to a second electrode of the fourth transistor and a second electrode of the fifth transistor, and a second electrode connected to the pulling-down control node;
a seventh transistor having a first electrode connected to the fourth voltage terminal, a gate connected to the fourth clock signal terminal, and a second electrode connected to the pulling-down control node;
an eighth transistor having a first electrode connected to the pulling-down control node, a gate connected to the pulling-up control node, and a second electrode connected to the third voltage terminal; and
a second capacitor having one terminal connected to the second electrode of the seventh transistor, and the other terminal connected to the third voltage terminal.

5. The shift register unit according to claim 1, wherein the reset module comprises:
a ninth transistor having a first electrode connected to the second electrode of the sixth transistor, a gate and a second electrode connected to the third signal input terminal.

6. The shift register unit according to claim 1, wherein the pulling-down module comprises:
a tenth transistor having a first electrode connected to the pulling-up control node, a gate connected to the pulling-down control node, and a second electrode connected to the third voltage terminal; and
an eleventh transistor having a first electrode connected to the signal output terminal, a gate connected to the pulling-down control node, and a second electrode connected to the third voltage terminal.

7. A gate driving circuit comprising a plurality of stages of the shift register unit according to claim 1;
wherein each stage of shift register unit comprises a bidirectional scan pre-charging module, a pulling-up module, a pulling-down control module, a reset module and a pulling-down module;
wherein the bidirectional scan pre-charging module is connected to a first signal input terminal, a first voltage terminal, a second signal input terminal, a second voltage terminal and a pulling-up control node, and is configured to control a potential at the pulling-up control node according to signals inputted from the first signal input terminal and the second signal input terminal, wherein the pulling-up control node is a connection point where the bidirectional scan pre-charging module and the pulling-up module are connected;
the pulling-up module is connected to the pulling-up control node, a first clock signal terminal and a signal output terminal, and is configured to allow the signal output terminal to output a signal at the first clock signal terminal under the control of the potential at the pulling-up control node;
the pulling-down control module is connected to a second clock signal terminal, a third clock signal terminal, a fourth clock signal terminal and a pulling-down control node, and is configured to control a potential at the pulling-down control node under the control of signals inputted from the second clock signal terminal, the third clock signal terminal, and the fourth clock signal terminal, wherein the pulling-down control node is a connection point where the pulling-down control module and the pulling-down module are connected;
the reset module is connected to a third signal input terminal and the pulling-down control node, and is configured to control the potential at the pulling-down control node according to a signal inputted from the third signal input terminal, and to reset the potential at the pulling-up control node and an output signal of the signal output terminal under the control of the potential at the pulling-down control node prior to an operation of the shift register unit; and
the pulling-down module is connected to the pulling-down control node, the pulling-up control node, a third voltage terminal and the signal output terminal, and is configured to pull down the potential at the pulling-up control node and the output signal of the signal output terminal to a level at the third voltage terminal under the control of the potential at the pulling-down control node,
wherein except a first stage of shift register unit, the first signal input terminal of each stage of shift register unit is connected to the signal output terminal of a previous stage of shift register unit adjacent thereto; and
except a last stage of shift register unit, the signal output terminal of each stage of shift register unit is connected to the first signal input terminal of a subsequent stage of shift register unit adjacent thereto.

8. The gate driving circuit according to claim 7, wherein except the first stage of shift register unit, the signal output terminal of each stage of shift register unit is connected to the second signal input terminal of a previous stage of shift register unit adjacent thereto; and
except the last stage of shift register unit, the second signal input terminal of each stage of shift register unit is connected to the signal output terminal of a subsequent stage of shift register unit adjacent thereto.

9. A display apparatus comprising the gate driving circuit according to claim 7.

10. The gate driving circuit according to claim 7, wherein the bidirectional scan pre-charging module comprises:
a first transistor having a first electrode connected to the first voltage terminal, a gate connected to the first signal input terminal, and a second electrode connected to the pulling-up control node;
a second transistor having a first electrode connected to the pulling-up control node, a gate connected to the second signal input terminal, and a second electrode connected to the second voltage terminal.

11. The gate driving circuit according to claim 7, wherein the pulling-up module comprises:
a third transistor having a first electrode connected to the first clock signal terminal, a gate connected to the pulling-up control node, and a second electrode connected to the signal output terminal; and
a first capacitor connected between the gate and the second electrode of the third transistor.

12. The gate driving circuit according to claim 7, wherein the pulling-down control module comprises:
a fourth transistor having a first electrode connected to the second clock signal terminal, and a gate connected to the second voltage terminal;
a fifth transistor having a first electrode connected to the third clock signal terminal, and a gate connected to the first voltage terminal;
a sixth transistor having a first electrode connected to a fourth voltage terminal, a gate connected to a second electrode of the fourth transistor and a second electrode of the fifth transistor, and a second electrode connected to the pulling-down control node;
a seventh transistor having a first electrode connected to the fourth voltage terminal, a gate connected to the fourth clock signal terminal, and a second electrode connected to the pulling-down control node;
an eighth transistor having a first electrode connected to the pulling-down control node, a gate connected to the pulling-up control node, and a second electrode connected to the third voltage terminal; and
a second capacitor having one terminal connected to the second electrode of the seventh transistor, and the other terminal connected to the third voltage terminal.

13. The gate driving circuit according to claim 7, wherein the reset module comprises:
a ninth transistor having a first electrode connected to the second electrode of the sixth transistor, a gate and a second electrode connected to the third signal input terminal.

14. The gate driving circuit according to claim 7, wherein the pulling-down module comprises:
a tenth transistor having a first electrode connected to the pulling-up control node, a gate connected to the pulling-down control node, and a second electrode connected to the third voltage terminal; and
an eleventh transistor having a first electrode connected to the signal output terminal, a gate connected to the pulling-down control node, and a second electrode connected to the third voltage terminal.

15. The display apparatus according to claim 9, wherein except the first stage of shift register unit, the signal output terminal of each stage of shift register unit is connected to the second signal input terminal of a previous stage of shift register unit adjacent thereto; and except the last stage of shift register unit, the second signal input terminal of each stage of shift register unit is connected to the signal output terminal of a subsequent stage of shift register unit adjacent thereto.

16. The display apparatus according to claim 9, wherein the bidirectional scan pre-charging module comprises:
a first transistor having a first electrode connected to the first voltage terminal, a gate connected to the first signal input terminal, and a second electrode connected to the pulling-up control node;
a second transistor having a first electrode connected to the pulling-up control node, a gate connected to the second signal input terminal, and a second electrode connected to the second voltage terminal.

17. The display apparatus according to claim 9, wherein the pulling-up module comprises:
a third transistor having a first electrode connected to the first clock signal terminal, a gate connected to the pulling-up control node, and a second electrode connected to the signal output terminal; and
a first capacitor connected between the gate and the second electrode of the third transistor.

18. The display apparatus according to claim 9, wherein the pulling-down control module comprises:
a fourth transistor having a first electrode connected to the second clock signal terminal, and a gate connected to the second voltage terminal;
a fifth transistor having a first electrode connected to the third clock signal terminal, and a gate connected to the first voltage terminal;
a sixth transistor having a first electrode connected to a fourth voltage terminal, a gate connected to a second electrode of the fourth transistor and a second electrode of the fifth transistor, and a second electrode connected to the pulling-down control node;
a seventh transistor having a first electrode connected to the fourth voltage terminal, a gate connected to the fourth clock signal terminal, and a second electrode connected to the pulling-down control node;
an eighth transistor having a first electrode connected to the pulling-down control node, a gate connected to the pulling-up control node, and a second electrode connected to the third voltage terminal; and
a second capacitor having one terminal connected to the second electrode of the seventh transistor, and the other terminal connected to the third voltage terminal.

19. The display apparatus according to claim 9, wherein the reset module comprises:
a ninth transistor having a first electrode connected to the second electrode of the sixth transistor, a gate and a second electrode connected to the third signal input terminal.

20. The display apparatus according to claim 9, wherein the pulling-down module comprises
a tenth transistor having a first electrode connected to the pulling-up control node, a gate connected to the pulling-down control node, and a second electrode connected to the third voltage terminal; and
an eleventh transistor having a first electrode connected to the signal output terminal, a gate connected to the pulling-down control node, and a second electrode connected to the third voltage terminal.

* * * * *